(12) United States Patent
Lee et al.

(10) Patent No.: US 6,787,372 B1
(45) Date of Patent: Sep. 7, 2004

(54) METHOD FOR MANUFACTURING MTJ CELL OF MAGNETIC RANDOM ACCESS MEMORY

(75) Inventors: Kye Nam Lee, Gyeonggi-do (KR); In Woo Jang, Seoul (KR); Young Jin Park, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 10/731,162

(22) Filed: Dec. 10, 2003

(30) Foreign Application Priority Data

Mar. 25, 2003 (KR) .............................. 10-2003-0018643

(51) Int. Cl.$^7$ .............................................. H01G 21/00
(52) U.S. Cl. ........................... 438/3; 438/238; 438/381
(58) Field of Search ........................... 438/3, 238–241, 438/381

(56) References Cited

U.S. PATENT DOCUMENTS

| | | | |
|---|---|---|---|
| 5,936,293 A | 8/1999 | Parkin | |
| 6,052,263 A | 4/2000 | Gill | |
| 6,359,805 B1 | 3/2002 | Hidaka | |
| 6,542,402 B2 | 4/2003 | Hidaka | |
| 2004/0027853 A1 * | 2/2004 | Huai et al. .................. | 365/158 |

\* cited by examiner

*Primary Examiner*—H. Jey Tsai
(74) *Attorney, Agent, or Firm*—Heller Ehrman White and McAuliffe LLP

(57) ABSTRACT

The present invention discloses methods for manufacturing MTJ cell of MRAM wherein two annealing process with different magnitudes of applied magnetic fields are performed. In accordance with the method, the formation process of second pinned magnetic layer comprises a first annealing process and a second annealing process, wherein a magnitude of a magnetic field applied during the first annealing process being larger than that of a magnetic field applied during the second annealing process.

3 Claims, 6 Drawing Sheets

METHOD FOR MANUFACTURING MTJ CELL OF MAGNETIC RANDOM ACCESS MEMORY

BACKGROUND OF THE INVENTION

1. Field of the Invention

The present invention relates to method for manufacturing MTJ cell of magnetic random access memory ('MRAM'), and in particular to an improved method for manufacturing MTJ cell of MRAM wherein two annealing process with different magnitudes of magnetic fields are performed to improve uniformity of the polarization direction of the pinned magnetic layer and MR ratio of the MTJ cell.

2. Description of the Background Art

Most of the semiconductor memory manufacturing companies have developed the MRAM, which uses a ferromagnetic material as one of the next generation memory devices.

The MRAM is a memory device for reading and writing information wherein multi-layer ferromagnetic thin films is used by sensing current variations according to a magnetization direction of the respective thin films. The MRAM has a high speed and low power consumption, and allows high integration density due to its unique properties of the magnetic thin film, and also performs a nonvolatile memory operation such as a flash memory.

The MRAM embodies a memory device by using a giant magneto resistive (GMR) or spin-polarized magneto-transmission (SPMT) phenomenon generated when the spin influences electron transmission.

The MRAM using the GMR phenomenon utilizes the fact that resistance remarkably varies when spin directions are different in two magnetic layers having a non-magnetic layer therebetween to implement a GMR magnetic memory device.

The MRAM using the SPMT phenomenon utilizes the fact that larger current transmission is generated when spin directions are identical in two magnetic layers having an insulating layer therebetween to implement a magnetic permeable junction memory device.

A MRAM includes a transistor and a MTJ cell (Magnetic Tunnel Junction cell).

FIGS. 1 and 2 are a cross-sectional diagram illustrating a conventional MTJ cell of SAF structure and a schematic diagram illustrating a conventional method for performing a magnetization of a pinned magnetic layer, respectively.

Referring to FIG. 1, a device isolation film (not shown), a first word line (not shown) which serves as a read line, a transistor (not shown) having a source/drain region, a ground line (not shown), a conductive layer (not shown) and a second word line (not shown) which serves as a write line are formed on a semiconductor substrate (not shown). A lower insulating layer planarizing the entire surface is then formed on the semiconductor substrate. The conductive layer contacts the semiconductor substrate through the lower insulating layer and the lower insulating layer exposes the top surface of the conductive layer.

Thereafter, a metal layer 11 for connection layer connected to the conductive layer is formed on the lower insulating layer. The metal layer 11 comprises a metal selected from the group consisting of tungsten, aluminum, platinum, copper, iridium, ruthenium and combinations thereof.

Next, a first pinned magnetic layer 13 and a second pinned magnetic layer 21 are sequentially deposited on the metal layer 11. The first pinned magnetic layer 13 comprises a magnetic material selected from the group consisting of Co, Fe, NiFe, CoFe, PtMn, IrMn and combinations thereof. The second pinned magnetic layer 21 comprises a stacked structure of magnetic layers 15 and 19 having an opposite polarization direction and an insulating film 17 therebetween. The formation process of the second pinned magnetic layer 21 comprises an annealing process while applying a magnetic field. For example, as shown in FIG. 2, when a magnetic field having a magnitude of 1 to 10 KOe is applied in the direction of arrow 31, the polarization directions of the magnetic layers 15 and 19 of the second pinned magnetic layer 21 is formed in the direction of arrow 29 which is perpendicular to a flat-zone of a wafer 27.

However, the resulting polarization directions of the magnetic layers 15 and 19 are not parallel as shown in FIG. 1, i.e. the polarization direction of the magnetic layer 19 has angle of θ with respect to the polarization direction of the magnetic layer 15. This is referred to as a magnetization flop. The magnetization flop decreases Magnetic Resistance ("MR") ratio. In order to prevent the magnetization flop, a magnetic field having a higher magnitude, for example a magnetic field having a magnitude ranging from 1 to 10 kOe, than that of a magnetic field used in the conventional method is applied during the annealing process. However, the magnitude of magnetic field must be increased as the integration density of the device is increased. Therefore, the method of increasing the magnitude of the applied magnetic field is limited to the capacity to generate a magnetic field.

Again referring to FIG. 1, a tunneling barrier layer 23 is formed on the second pinned magnetic layer 21. The tunneling barrier layer 23 consists of an insulating layer. Thereafter, a free magnetic layer 25 is deposited on the tunneling barrier layer 23. A MTJ capping layer (not shown) is then formed on the free magnetic layer 25. The MTJ capping layer, the free magnetic layer 25, the tunneling barrier layer 23, the second pinned magnetic layer 21 and the first pinned magnetic layer 13 are patterned via photolithography process using a MTJ cell mask (not shown) to form a MTJ cell.

As described above, in accordance with the method for manufacturing MTJ cell of MRAM, the spin direction uniformity of the second pinned magnetic layer having a SAF structure is reduced to induce magnetization flop, resulting in reduction of the MR ratio and degradation of device characteristics.

SUMMARY OF THE INVENTION

Accordingly, it is an object of the present invention to provide method for manufacturing MTJ cell of MRAM wherein two annealing process with different magnitudes of applied magnetic fields are performed to improve uniformity of the polarization direction of the pinned magnetic layer, MR ratio of the MTJ cell.

In order to achieve the above-described object of the invention, there is provided a method for manufacturing MTJ cell of MRAM comprising: forming a metal layer for connection layer connected to a semiconductor substrate through a lower insulating layer; forming a first pinned magnetic layer on the metal layer; forming a second pinned magnetic layer on the metal layer, wherein a first annealing process and a second annealing process are performed in sequence with a first and a second magnetic fields applied respectively, the magnitude of the first magnetic field being larger than that of the second magnetic field; sequentially forming a tunneling barrier layer, a free magnetic layer and a MTJ capping layer on the second pinned magnetic layer; and patterning the MTJ capping layer, the free magnetic layer, the tunneling barrier layer, the first amorphous layer and the pinned magnetic layer using a MTJ cell mask to form a MTJ cell.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing MTJ cell of a MRAM in accordance with a preferred embodiment of the present invention will now be described in detail with reference to the accompanying drawings.

Figure 1:
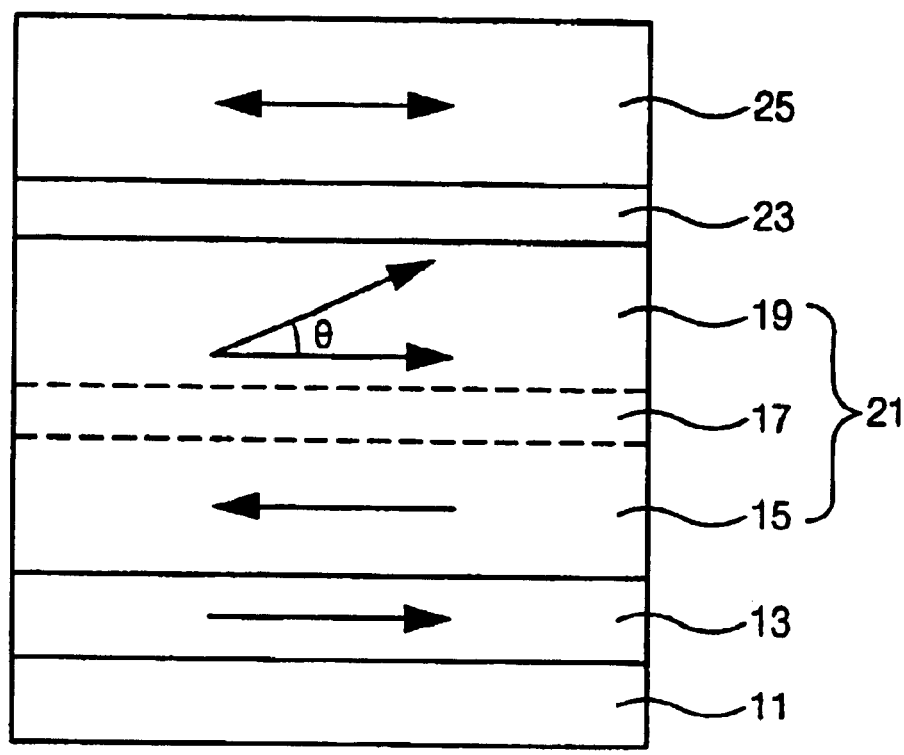
FIGS. 1 and 2 is a cross-sectional diagram illustrating a conventional MTJ cell of SAF structure and a schematic diagram illustrating a conventional method for performing a magnetization of a pinned magnetic layer, respectively.
Figure 2:
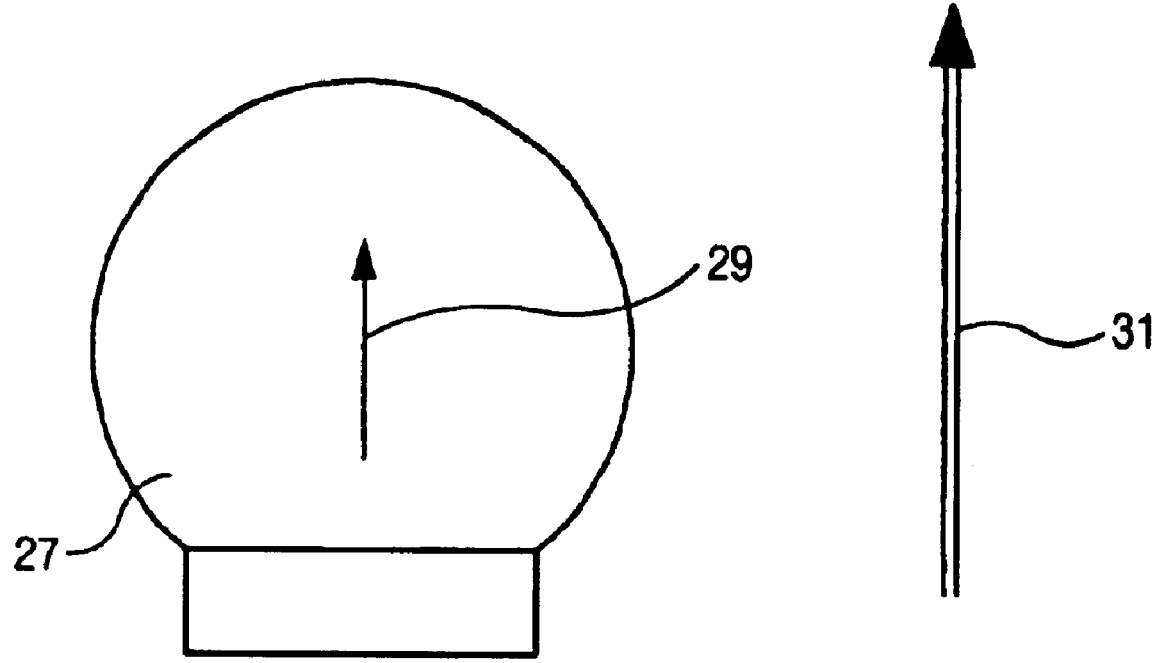
Figure 3:
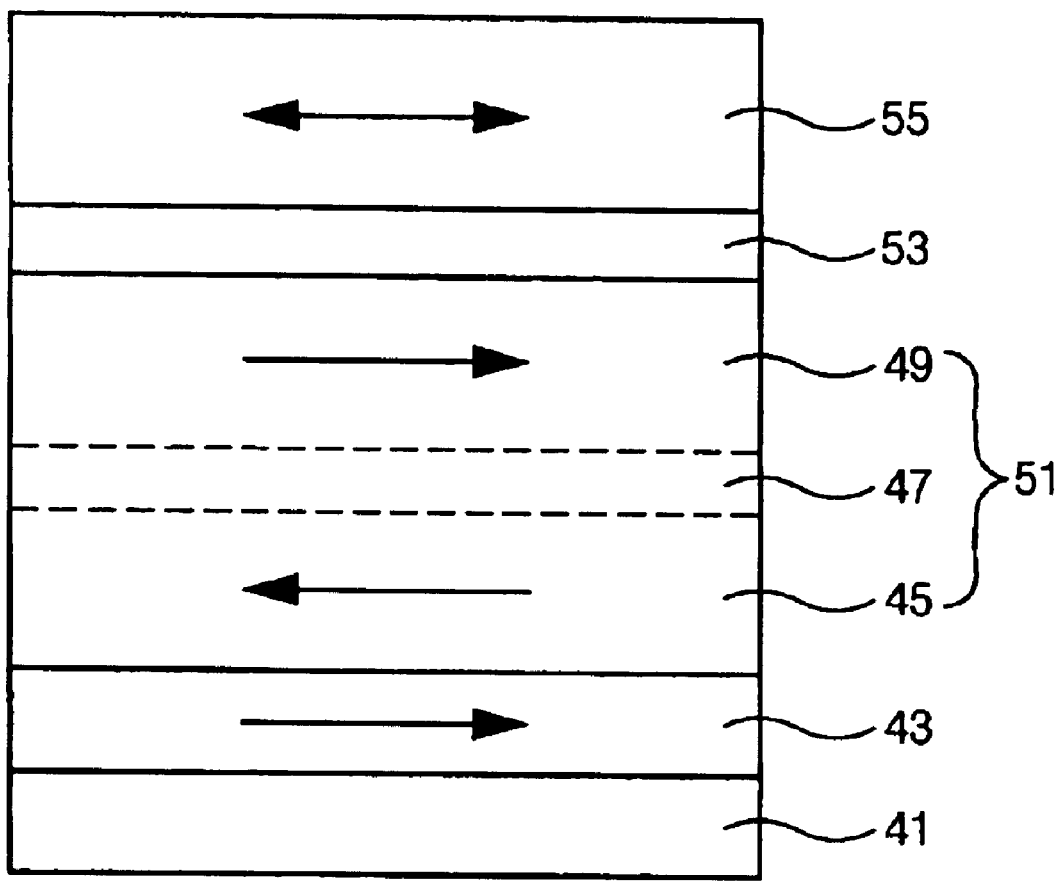
FIGS. 3 and 4 is a cross-sectional diagram illustrating a MTJ cell of SAF structure in accordance with the present invention and a schematic diagram illustrating a method for performing a magnetization of a pinned magnetic layer in accordance with the present invention, respectively.
Figure 4:
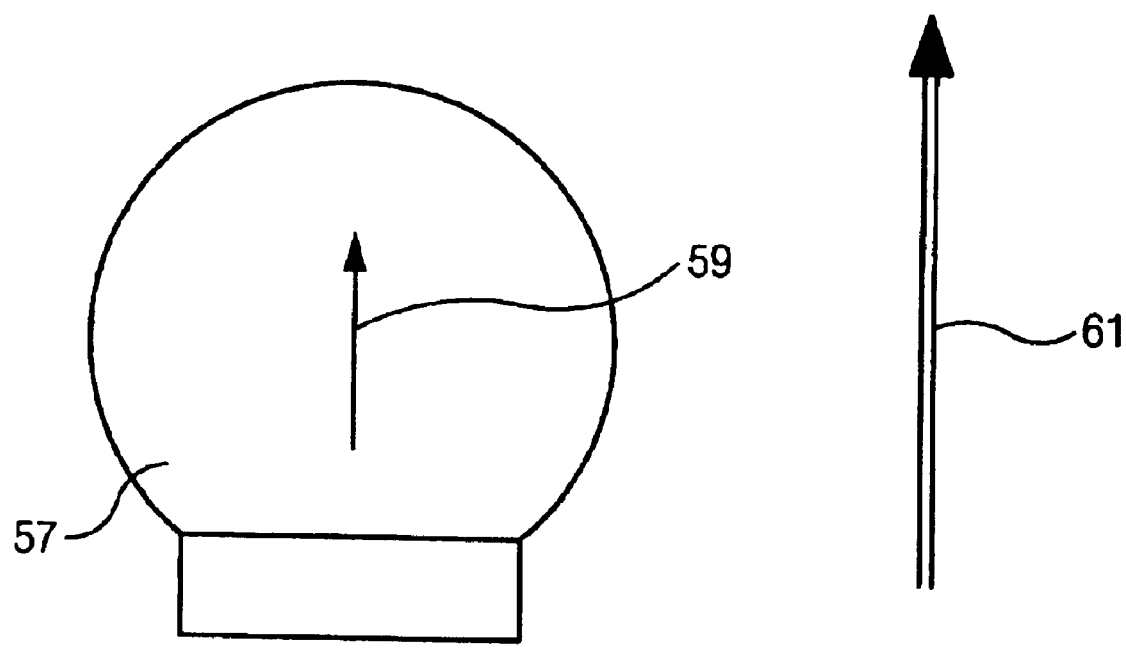

FIGS. 3 and 4 is a cross-sectional diagram illustrating a MTJ cell of SAF structure in accordance with the present invention and a schematic diagram illustrating a method for performing a magnetization of a pinned magnetic layer in accordance with the present invention, respectively.

Referring to FIG. 3, a device isolation film (not shown), a first word line (not shown) which serves as a read line, a transistor (not shown) having a source/drain region, a ground line (not shown), a conductive layer (not shown) and a second word line (not shown) which serves as a write line are formed on a semiconductor substrate (not shown). A lower insulating layer planarizing the entire surface is then formed on the semiconductor substrate. The conductive layer contacts the semiconductor substrate through the lower insulating layer and the lower insulating layer exposes the top surface of the conductive layer.

Thereafter, a metal layer 41 for connection layer connected to the conductive layer is formed on the lower insulating layer. The metal layer 41 comprises a metal selected from the group consisting of tungsten, aluminum, platinum, copper, iridium, ruthenium and combinations thereof.

Next, a first pinned magnetic layer 43 and a second pinned magnetic layer 51 are sequentially deposited on the metal layer 41. The first pinned magnetic layer 43 comprises a magnetic material selected from the group consisting of Co, Fe, NiFe, CoFe, PtMn, IrMn and combinations thereof. The second pinned magnetic layer 51 comprises a stacked structure of magnetic layers 45 and 49 having an opposite polarization direction and an insulating film 47 therebetween. The formation process of the second pinned magnetic layer 21 comprises a first and a second annealing processes while applying a first magnetic field and a second magnetic field, respectively. The first annealing process is performed at a temperature ranging from 250 to 300° C. and the first magnetic field has a magnitude ranging from 1 to 10 KOe. The second annealing process is performed at a temperature ranging from 250 to 300° C. and the second magnetic field has a magnitude ranging from 100 to 999 Oe. For example, as shown in FIG. 4, the first magnetic field having a magnitude ranging from 1 to 10 KOe is applied in the direction of arrow 61 which is perpendicular to a flat-zone of a wafer 57 during the first annealing process and the second magnetic field having a magnitude ranging from 100 to 999 Oe is applied in the direction of arrow 61 during the second annealing process. The second annealing process improves the uniformity of polarization direction to prevent magnetization flop.

Again referring to FIG. 3, a tunneling barrier layer 53 is formed on the second pinned magnetic layer 51. The tunneling barrier layer 53 consists of a non-magnetic insulating layer.

Thereafter, a free magnetic layer 55 is deposited on the tunneling barrier layer 53. A MTJ capping layer (not shown) is then formed on the free magnetic layer 55. The MTJ capping layer, the free magnetic layer 55, the tunneling barrier layer 53, the second pinned magnetic layer 51 and the first pinned magnetic layer 43 are patterned via photolithography process using a MTJ cell mask (not shown) to form a MTJ cell.

Figure 5:
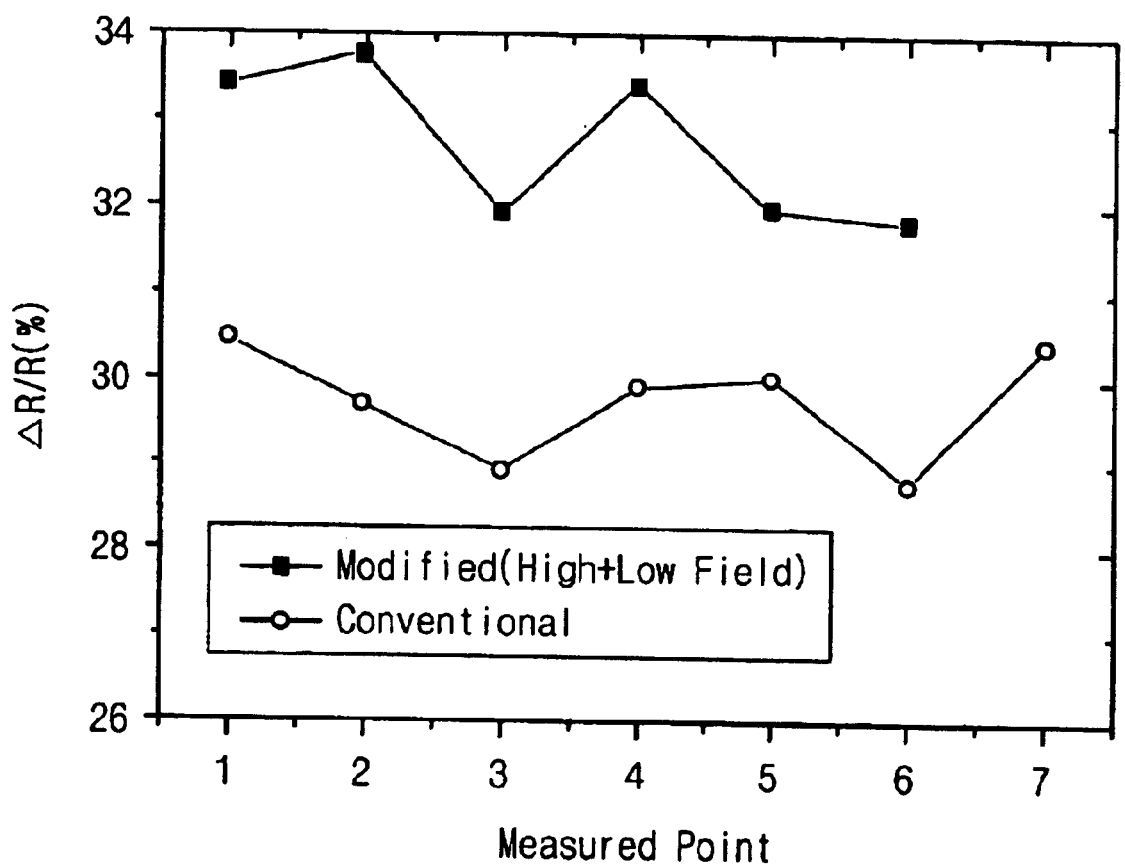
FIG. 5 is a graph illustrating MR ratio of MTJ cell in accordance with the conventional method and the inventive method.
Figure 6:
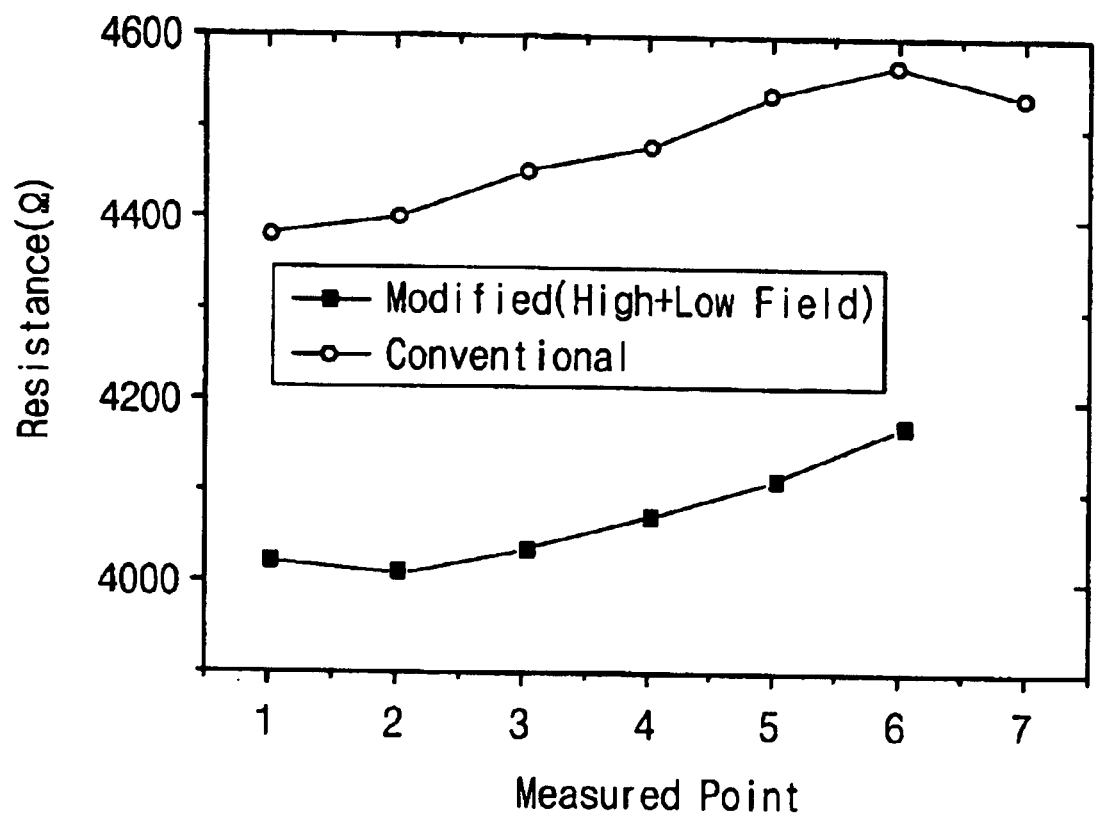
FIG. 6 is a graph illustrating resistance of MTJ cell in accordance with the conventional method and the inventive method.

FIG. 5 is a graph illustrating MR ratio of MTJ cell in accordance with the conventional method and the inventive method, and FIG. 6 is a graph illustrating resistance of MTJ cell in accordance with the conventional method and the inventive method. The MTJ cell of the present invention has higher MR ratio and lower resistance than the conventional MTJ cell.

As discussed earlier, in accordance with the present invention, the method for manufacturing MTJ cell of MRAM provides uniform polarization direction of the pinned magnetic layer without a magnetization flop, high MR ratio by sequentially performing two annealing process with different magnitudes of applied magnetic fields.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing MTJ cell of MRAM comprising:

forming a metal layer for connection layer connected to a semiconductor substrate through a lower insulating layer;

forming a first pinned magnetic layer on the metal layer;

forming a second pinned magnetic layer on the metal layer, wherein a first annealing process and a second annealing process are performed in sequence with a first and a second magnetic fields applied respectively, the magnitude of the first magnetic field being larger than that of the second magnetic field;

sequentially forming a tunneling barrier layer, a free magnetic layer and a MTJ capping layer on the second pinned magnetic layer; and patterning the MTJ capping layer, the free magnetic layer, the tunneling barrier layer, the first and second pinned magnetic layers using a MTJ cell mask to form a MTJ cell.

2. The method according to claim 1, wherein the second pinned magnetic layer comprises a stacked structure of a magnetic layer-insulating layer-magnetic layer.

3. The method according to claim 1, wherein the first annealing process and a second annealing process are performed at a temperature ranging from 250 to 300° C., respectively, and the magnitude of the magnetic field applied during the first annealing process ranges from 1 to 10 KOe and the magnitude of the magnetic field applied during the second annealing process ranges from 100 to 999 Oe.

* * * * *